(12) United States Patent
Chang et al.

(10) Patent No.: US 9,866,226 B2
(45) Date of Patent: *Jan. 9, 2018

(54) ANALOG-TO-DIGITAL CONVERSION WITH NOISE INJECTION VIA WAVEFRONT MULTIPLEXING TECHNIQUES

(71) Applicant: SPATIAL DIGITAL SYSTEMS, INC., Agoura Hills, CA (US)

(72) Inventors: Donald C.D. Chang, Thousand Oaks, CA (US); Tzer-Hso Lin, Chatsworth, CA (US); Yuanchang Liu, Canoga Park, CA (US)

(73) Assignee: Spatial Digital Systems, Inc., Agoura Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/339,882

(22) Filed: Oct. 31, 2016

(65) Prior Publication Data
US 2017/0047935 A1 Feb. 16, 2017

Related U.S. Application Data

(63) Continuation of application No. 14/988,809, filed on Jan. 6, 2016, now Pat. No. 9,484,970, which is a
(Continued)

(51) Int. Cl.
*H03M 1/06* (2006.01)
*H03M 1/00* (2006.01)
(Continued)

(52) U.S. Cl.
CPC ......... *H03M 1/002* (2013.01); *H03M 1/0641* (2013.01); *H03M 1/08* (2013.01);
(Continued)

(58) Field of Classification Search
CPC .......... H03M 1/20; H03M 1/002; H03M 1/08; H03M 1/188
(Continued)

(56) References Cited

U.S. PATENT DOCUMENTS 5,077,562 A * 12/1991 Chang .................. H01Q 3/26
342/195
5,630,221 A * 5/1997 Birleson ................ G01S 7/34
341/139

(Continued)

*Primary Examiner* — Jean B Jeanglaude

(57) ABSTRACT

An analog-to-digital conversion system includes a first processor, a bank of N analog-to-digital converters, and a second processor. The first processor receives M input signal streams, performs a wave-front multiplexing transform that includes a first set of wave-front vectors on the M input signal streams in analog domain and outputs concurrently N mixed signal streams, M and N being integers and N≥M>1. The N analog-to-digital converters convert the N mixed signal streams from analog format to digital format and output concurrently N digital data streams. The second processor receives the N digital data streams, performs a wave-front de-multiplexing transform that includes a second set of wave-front vectors on the N digital data streams in digital domain and outputs concurrently N output data streams such that the N output data streams include M output data streams that correspond respectively to the M input signal streams.

20 Claims, 2 Drawing Sheets

Related U.S. Application Data continuation of application No. 14/637,405, filed on Mar. 4, 2015, now Pat. No. 9,246,508, which is a continuation of application No. 13/762,413, filed on Feb. 8, 2013, now Pat. No. 8,981,976, which is a continuation of application No. 12/985,044, filed on Jan. 5, 2011, now Pat. No. 8,384,572.

(60) Provisional application No. 61/381,381, filed on Sep. 9, 2010.

(51) Int. Cl.
*H03M 1/12* (2006.01)
*H04B 1/04* (2006.01)
*H04B 7/10* (2017.01)
*H03M 1/08* (2006.01)
*H03M 1/18* (2006.01)
*H03M 1/20* (2006.01)
*H04B 1/12* (2006.01)
*H04L 27/06* (2006.01)

(52) U.S. Cl.
CPC ........... *H03M 1/12* (2013.01); *H03M 1/1205* (2013.01); *H03M 1/188* (2013.01); *H03M 1/20* (2013.01); *H04B 1/0475* (2013.01); *H04B 1/123* (2013.01); *H04B 7/10* (2013.01); *H04L 27/06* (2013.01); *H03M 1/1215* (2013.01)

(58) Field of Classification Search
USPC .................. 341/155, 139, 131, 144, 118
See application file for complete search history.

(56) References Cited

U.S. PATENT DOCUMENTS

| | | | | |
|---|---|---|---|---|
| 5,953,429 A * | 9/1999 | Wakai | ................. | H04H 20/62 348/E7.05 |
| 6,049,251 A * | 4/2000 | Meyer | ................. | H03G 1/0023 330/124 R |
| 6,526,139 B1 * | 2/2003 | Rousell | ................. | G10L 15/30 379/406.01 |
| 7,239,260 B2 * | 7/2007 | Min | ................. | H03M 1/1225 341/155 |
| 7,969,336 B2 * | 6/2011 | Yoshioka | ................. | G11C 27/02 327/91 |
| 2010/0085245 A1 * | 4/2010 | Fischi | ................. | H01Q 3/2676 342/195 |
| 2012/0274364 A1 * | 11/2012 | Chen | ................. | H03M 1/0836 327/101 |

* cited by examiner

ANALOG-TO-DIGITAL CONVERSION WITH NOISE INJECTION VIA WAVEFRONT MULTIPLEXING TECHNIQUES

CROSS-REFERENCE TO RELATED APPLICATIONS

This application is a continuation of application Ser. No. 14/988,809, filed on Jan. 6, 2016, which is a continuation of application Ser. No. 14/637,405, filed on Mar. 4, 2015, now U.S. Pat. No. 9,246,508, which is a continuation of application Ser. No. 13/762,413, filed on Feb. 8, 2013, now U.S. Pat. No. 8,981,976, which is a continuation of application Ser. No. 12/985,044, filed on Jan. 5, 2011, now U.S. Pat. No. 8,384,572, which claims the benefit of U.S. provisional application Ser. No. 61/381,381, filed on Sep. 10, 2010.

BACKGROUND

1. Field

The present invention relates to architectures and designs of digital systems. More specifically, but without limitation thereto, the present invention pertains to an electronic signal conversion system that utilizes a noise injection system in order to maintain or increase signal resolution and increase the dynamic range. The present invention also offers a more time-efficient conversion as well as a more cost-effective conversion method.

2. Prior Art

The following is a tabulation of some prior art that presently appears relevant:

| U.S. Patents | | | |
|---|---|---|---|
| Pat. No. | Kind Code | Issue Date | Patentee |
| 5,077,562 | | 1991 Dec. 31 | Chang et al. |
| 5,630,221 | | 1997 May 13 | Birleson |
| 6,049,251 | | 2000 Apr. 11 | Meyer |
| 6,526,139 | B1 | 2003 Feb. 25 | Rousell et al. |

Non-Patent Literature Documents

Estrada, A.; Autotestcon, 2007 IEEE, "Improving high speed analog to digital converter dynamic range by noise injection".

Currently in the electronics field, conversions between digital and analog signals are necessary for many day-to-day electronic operations. Analog signals are signals that utilize properties of the medium to convey the signal's information, essentially used in its original form. In particular for the field of electronics, an analog signal is taking a signal and translating it directly into electronic pulses. On the other hand, a signal is considered digital when it is processed into discrete time signals, usually in the form of a binary code (1s and 0s instead of a continuously variable function as found in analog signals). Nowadays, although nearly all information is encrypted digitally, analog signals commonly function as carrier signals for information transmission.

As a result, conversions between analog and digital signals for modern electronics are a common occurrence. For example, portable cellular phone signals are broadcast in the analog format and need to be converted to a digital signal within the phone itself for practical use.

Television signals are also transmitted in the analog spectrum and have to be converted to digital format for signal processing.

A key performance index of conversion from analog to digital (A/D) is the dynamic range, which is the ratio between the smallest and largest possible values of changeable quantities. Additionally, only signal strengths within the specified dynamic range can be detected. As a result, the dynamic range that is factored into A/D circuit design is required to be reasonably wide, and in some cases, to be as wide as possible. For instance, color perceptible to the human eye ranges from $4.28 \times 10^{14}$ Hz (hertz) to $7.14 \times 10^{14}$ Hz. If, for example, a TV's dynamic range cannot cover this spectrum, the quality of the TV signal will degrade as it cannot show all the colors in the received TV video signal.

Utilizing such wide dynamic ranges has several issues. While higher dynamic range means better precision and resolution of digital signals, the higher dynamic range also necessitates more expensive and precise equipment. There are cases where it is impossible to implement such devices either because it is impractical or too costly, such as in mobile devices.

Additionally, analog-to-digital conversions have an issue with unwanted noise being introduced into the signal. One source of noise is the conversion itself, as an analog signal is changed to a format that eliminates some of the fine resolution of the signal. Because of this, research has been performed to increase the dynamic range of analog-to-digital converters without changing the resolution, as well as reducing unwarranted and unwanted noise. The present embodiment of the invention aims to mitigate both of these factors in A/D converters by introducing a "noise" injection to essentially cancel out any unwanted noise as well as maintain a high dynamic range so that resolution is not lost in the conversion.

SUMMARY OF THE INVENTION

The present invention is a noise injection system for the purpose of eliminating unwanted noise while maintaining a high dynamic range for analog to digital conversions, comprising: a wave front de-multiplexer, multiple analog-to-digital converters and a wave front multiplexer.

The noise injection system performs as follows. Multiple input signal streams, noise injection streams, and a ground are all connected to a wave-front multiplexer, where the signal and noise signal outputs are connected to a multiplexer. Here, the signals are multiplexed (combined) into N data streams, each with a signal component of all inputs. The multiplexer output lines are transmitted to A/D converters. After conversion to digital format, the sampled digitized signals are transmitted to a wave-front de-multiplexer, where the data streams are recovered into output signals matching the inputs. These signals are then reconverted from digital to analog if necessary.

Through injecting noises which could be eliminated by filters afterwards, the present invention enhances signal strength while maintaining a high dynamic range. Weak signals out of the A/D converter dynamic range are now able to be detected because of added noise. In such a way, the signals' dynamic range is increased. Additionally, injecting noise also has the benefit of cancelling out any unwanted noise, thus increasing clarity and signal resolution.

An alternative embodiment of the present invention involves utilizing an optimization processor that is connected to the wave-front de-multiplexer. Samples of the signals being processed are sent to the processor, where an optimization loop adaptively adjusts the strength, phase, and wave front vectors of the noise in order to cancel out the unwanted noise. After processing, the signals are re-introduced into the signal streams for proper cancellation of unwanted noise.

With the proposed noise injection system, the dynamic range of the analog-to-digital conversion system can be accommodated with the injected noise level without redesigning the system. Furthermore, the signal converters in this invention process fewer bits of data, thus reducing power requirements, cost and complexity.

Figure 1:
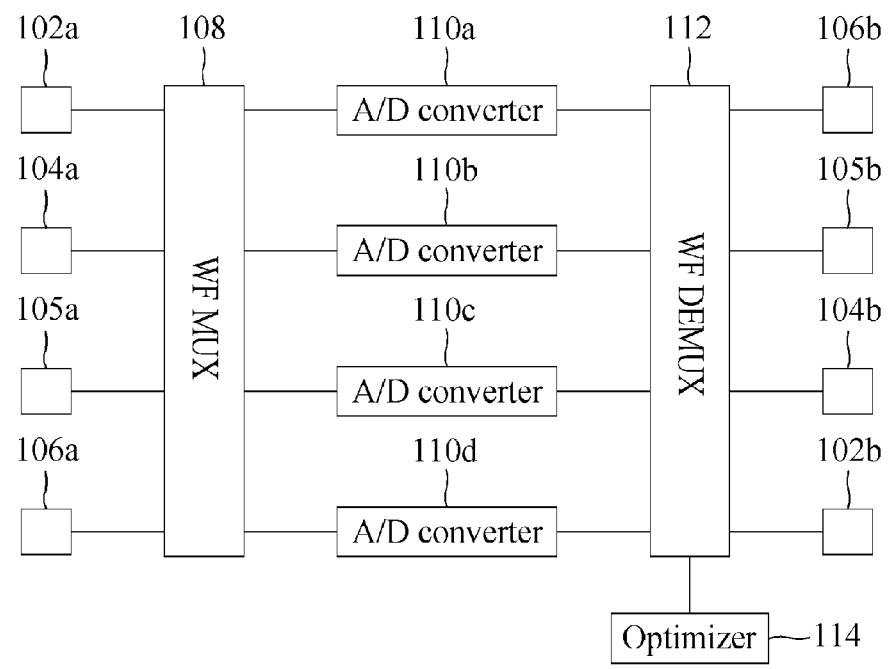
FIG. 1 is an illustration of an analog/digital conversion system with an attached optimizer

| DRAWINGS - Reference Numerals | | | |
|---|---|---|---|
| 102a | Incoming signal (analog) | 102b | Incoming signal (digital) |
| 104a | Noise to inject (analog) | 104b | Injected noise (digital) |
| 105a | Ground, no signal (analog) | 105b | Ground, no signal (digital) |
| 106a | Ground, zero (analog) | 106b | Ground, zero (digital) |
| 108 | Wave front multiplexer | 110a, b, c, d | Analog to digital converter |
| 112 | Wave front de-multiplexer | 114 | Optimizer |

DETAILED DESCRIPTION OF THE PREFERRED EMBODIMENT

The present invention relates to the architecture and design of electronic systems, and, in particular to electronic signal conversion hardware architecture and design.

An implementation of one embodiment is shown in FIG. 1. In this particular embodiment, there are 4 input ports with 4 signal inputs including: incoming signal 102a, injected noise signal input 104a, and two grounded signals 105a, 106a, are connected to multiplexer 108. The input ports in the actual implementation may vary, and not limited to 4 input ports. The injected noise signal 104a and incoming signal 102a will be split in wave-front multiplexer 108 and mixed with each other in order to improve dynamic range of the whole system. Ground 105a and 106a will be used as diagnostic signals.

Wave-front multiplexer 108 equally splits and mixes M input signals to form N output signals, where, in this embodiment, M and N are both 4. Each of mixed N signals contains information from all M input signals. Each output of N signals maintains a fixed relative phase difference and N output signals form a wave front vector. For example, in case of FIG. 1, if I use a 4-point Fast Fourier Transformer (FFT) as a wave front multiplexer, then the phase difference between each output signal is $e^{-i\pi/2}$. The wave front vector is $[1, e^{-i\pi/2}, e^{-i\pi}, e^{-i3\pi/2}]$. This wave front vector will be used to recover the mixed signals.

Thus, after wave front multiplexer 108 processes the N inputs, 4 output signals are already incoming signals mixed with proper noises. If FFT is used as a wave front multiplexer, each channel only possesses A/D bandwidth of the original signal. As a result, cheap, low speed and low resolution A/D converters 110a, 110b, 110c and 110d are used to sample these signals. After conversion, the signals are all in the digital format.

A wave front de-multiplexer 112 performs the inverse process of wave front multiplexer. The de-multiplexer 112 is used to recover the mixed signals to the original input signals in the digital domain. For example, if FFT is used previously, an Inverse Fast Fourier Transformer (IFFT) will be used here. After this, an incoming signal in digital domain 102b, an injected noise in digital domain 104b, ground in digital domain 105b and 106b are recovered.

All signals are recovered due to the wave front vector which represents phase differences among signals. Therefore, if any distortion occurred in previous steps, the wave front vector will be distorted. However, with the help of optimizer 114, even if signals are distorted, recovery can still be successful. By using diagnostic signals ground 105a and 106a, if signal recovery is successful, the recovered signals 105b and 106b should be perfectly zero. Optimizer 114 adaptively adjusts the wave front vector until the signals 105b and 106b reach zero. Thus, any previous distortion is compensated for, and the output signals exhibit improved clarity than without the present invention.

ALTERNATIVE EMBODIMENTS

Figure 2:
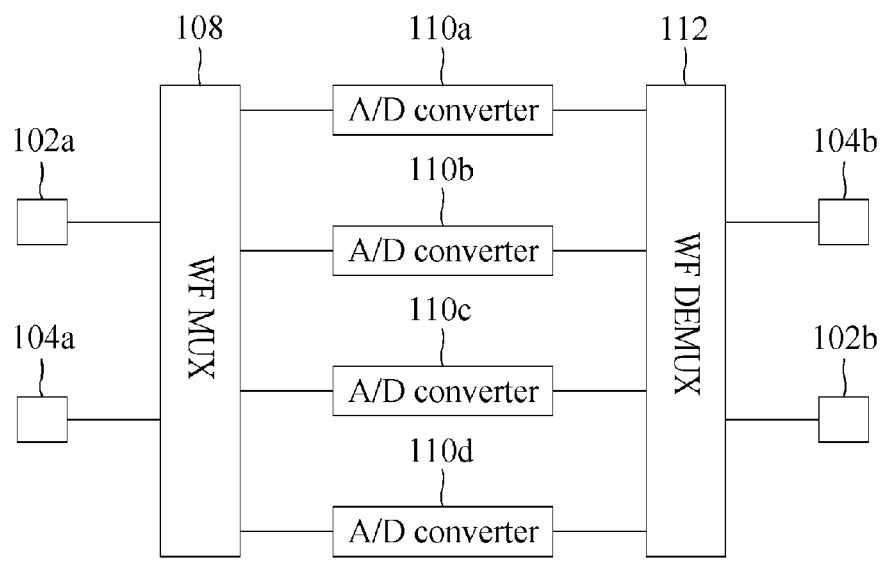
FIG. 2 is an illustration of an alternative implementation analog/digital conversion system

An alternative embodiment of the noise injection system is shown in FIG. 2. Incoming signal 102a and injected noise 104a input signals in this embodiment. The rest of this embodiment is the same as the main embodiment. But optimizer, since there is no reference signal such as 105a or 106b, quality of the output signal cannot be determined.

Figure 3:
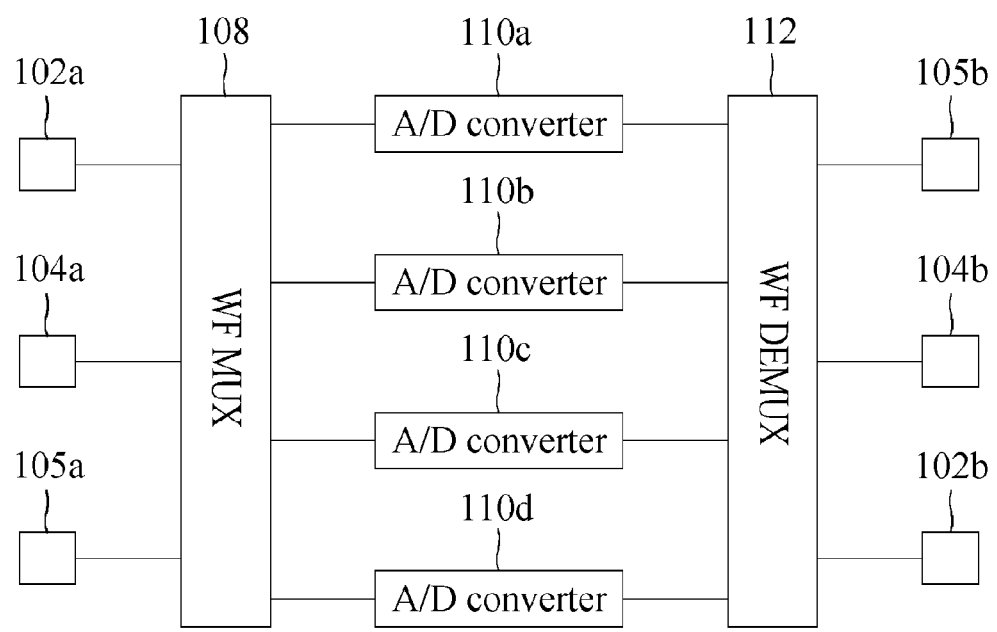
FIG. 3 is an illustration of another alternative implementation of the conversion system

Another alternative embodiment of the noise injection system is shown in FIG. 3. The input signals include signal 102a, injected noise 104a and one grounded signal 105a or 106a. The rest of this embodiment is the same as main embodiment but optimizer. Signal 105b can be used as a diagnostic signal. It is to indicate the quality of the output signal 102b.

What is claimed is:

1. An analog-to-digital conversion system comprising:
   a first processor configured to receive M input signal streams, perform a wave-front multiplexing transform in analog domain on the M input signal streams and output concurrently N mixed signal streams, M and N being integers and N≥M>1, the wave-front multiplexing transform comprising first wave-front vectors;
   a bank of N analog-to-digital converters coupled to the first processor, the N analog-to-digital converters converting the N mixed signal streams from analog format to digital format and outputting concurrently N digital data streams; and
   a second processor coupled to the bank of N analog-to-digital converters, the second processor being configured to receive the N digital data streams, perform a wave-front de-multiplexing transform in digital domain on the N digital data streams and output concurrently N output data streams such that the N output data streams comprise M output data streams that correspond respectively to the M input signal streams, the wave-front de-multiplexing transform comprising second wave-front vectors.

2. The analog-to-digital conversion system of claim 1, wherein N is greater than M, wherein the first processor further receives N-M diagnostic signals, and wherein the second processor outputs N-M output data streams that correspond respectively to the N-M diagnostic signals.

3. The analog-to-digital conversion system of claim 2, wherein at least one of the N-M diagnostic input signals is a ground signal.

4. The analog-to-digital conversion system of claim 2, further comprising an optimizer coupled to the second processor, the optimizer adaptively adjusting at least one of the second wave-front vectors such that each of the N-M output data streams that correspond respectively to the N-M diagnostic signals reaches a respective desired data stream value.

5. The analog-to-digital conversion system of claim 1, wherein the M input signal streams comprise at least one injected noise signal stream.

6. The analog-to-digital conversion system of claim 4, further comprising an optimizer coupled to the second processor, the optimizer adaptively adjusting strength and phase of at least one of the N digital data streams.

7. The analog-to-digital conversion system of claim 1, wherein each of the first wave-front vectors comprises relative phase differences between the N mixed signal streams, and wherein each of the second wave-front vectors comprises relative phase differences between the N output data streams.

8. The analog-to-digital conversion system of claim 1, wherein the first processor performs a Fourier transform in analog domain on the M input signal streams, and wherein the second processor performs a corresponding inverse Fourier transform in digital domain on the N digital data streams.

9. The analog-to-digital conversion system of claim 1, wherein each of the M output data streams is equal to a digital representation of a respective one of the M input signal streams.

10. The analog-to-digital conversion system of claim 1, wherein each of the N mixed signal streams comprises information from all the M input signal streams.

11. A method for analog-to-digital conversion, the method comprising:
inputting M input signal streams to a first processor, M being an integer greater than 1;
performing a wave-front multiplexing transform in analog domain on the M input signal streams, via the first processor, the wave-front multiplexing transform comprising first wave-front vectors;
outputting concurrently from the first processor N mixed signal streams, N being an integer greater than or equal to M;
converting the N mixed signal streams from analog format to digital format and outputting concurrently N digital data streams, via a bank of N analog-to-digital converters coupled to the first processor; and
inputting the N digital data streams to a second processor coupled to the bank of N analog-to-digital converters;
performing a wave-front de-multiplexing transform in digital domain on the N digital data streams, via the second processor, the wave-front de-multiplexing transform comprising second wave-front vectors; and
outputting concurrently from the second processor N output data streams such that the N output data streams comprise M output data streams that correspond respectively to the M input signal streams.

12. The method of claim 11, wherein N is greater than M, further comprising:
inputting N-M diagnostic signals to the first processor; and
outputting from the second processor N-M output data streams that correspond respectively to the N-M diagnostic signals.

13. The method of claim 12, wherein inputting the N-M diagnostic signals to the first processor comprises inputting at least one ground signal.

14. The method of claim 12, further comprising:
adjusting adaptively at least one of the second wave-front vectors such that each of the N-M output data streams that correspond respectively to the N-M diagnostic signals reaches a respective desired data stream value, via an optimizer coupled to the second processor.

15. The method of claim 11, wherein inputting the M input signal streams to the first processor comprises inputting at least one injected noise signal stream.

16. The method of claim 14, further comprising:
adjusting adaptively strength and phase of at least one of the N digital data streams, via an optimizer coupled to the second processor.

17. The method of claim 11, wherein each of the first wave-front vectors comprises relative phase differences between the N mixed signal streams, and wherein each of the second wave-front vectors comprises relative phase differences between the N output data streams.

18. The method of claim 11, wherein performing a wave-front multiplexing transform in analog domain on the M input signal streams comprises performing a Fourier transform in analog domain on the M input signal streams, and wherein performing a wave-front de-multiplexing transform in digital domain on the N digital data streams comprises performing a corresponding inverse Fourier transform in digital domain on the N digital data streams.

19. The method of claim 11, wherein each of the M output data streams is equal to a digital representation of a respective one of the M input signal streams.

20. The method of claim 11, wherein each of the N mixed signal streams comprises information from all the M input signal streams.

* * * * *